(12) United States Patent
Shimizu et al.

(10) Patent No.: US 8,207,618 B2
(45) Date of Patent: Jun. 26, 2012

(54) SEMICONDUCTOR DEVICE AND METHOD OF MANUFACTURING THE SAME

(75) Inventors: Kazumichi Shimizu, Osaka (JP); Yoshihiro Tomura, Osaka (JP); Masahiro Ono, Osaka (JP)

(73) Assignee: Panasonic Corporation, Osaka (JP)

( * ) Notice: Subject to any disclaimer, the term of this patent is extended or adjusted under 35 U.S.C. 154(b) by 271 days.

(21) Appl. No.: 12/692,872

(22) Filed: Jan. 25, 2010

(65) Prior Publication Data

US 2010/0187675 A1    Jul. 29, 2010

(30) Foreign Application Priority Data

Jan. 29, 2009    (JP) .................................. 2009-017413

(51) Int. Cl.
*H01L 23/28*    (2006.01)
(52) U.S. Cl. ........................................ 257/787; 438/127
(58) Field of Classification Search .................. 257/787, 257/778, 797; 438/113, 126, 127
See application file for complete search history.

(56) References Cited

U.S. PATENT DOCUMENTS

| | | | |
|---|---|---|---|
| 5,892,289 A * | 4/1999 | Tokuno | 257/783 |
| 6,448,665 B1 | 9/2002 | Nakazawa et al. | |
| 7,898,093 B1 * | 3/2011 | Darveaux et al. | 257/787 |
| 2001/0042913 A1 | 11/2001 | Fukuda et al. | |
| 2002/0140108 A1 | 10/2002 | Johnson | |
| 2003/0122223 A1 | 7/2003 | Nakamura | |
| 2004/0136123 A1 * | 7/2004 | Nakamura et al. | 361/35 |
| 2004/0150118 A1 | 8/2004 | Honda | |
| 2007/0290310 A1 | 12/2007 | Kusano et al. | |
| 2007/0296079 A1 | 12/2007 | Huang et al. | |
| 2009/0115044 A1 | 5/2009 | Hoshino et al. | |

FOREIGN PATENT DOCUMENTS

| | | |
|---|---|---|
| JP | 04-217375 | 8/1992 |
| JP | 2000-164628 | 6/2000 |
| JP | 2001-118968 | 4/2001 |
| JP | 2002-141444 | 5/2002 |
| JP | 2002-184796 | 6/2002 |
| JP | 2002-231761 | 8/2002 |
| JP | 3420748 | 4/2003 |
| JP | 2004-281899 | 10/2004 |
| JP | 2005-135997 | 5/2005 |
| JP | 2006-128488 | 5/2006 |
| JP | 101090098 | 12/2007 |

* cited by examiner

*Primary Examiner* — Sheila V Clark
(74) *Attorney, Agent, or Firm* — Hamre, Schumann, Mueller & Larson, P.C.

(57) ABSTRACT

This semiconductor device is a semiconductor device in which a semiconductor element is flip-chip mounted onto a circuit substrate and the semiconductor element is covered and sealed with a sealing resin. A recess portion is formed in the sealing resin on a surface opposite to the mounting surface of the semiconductor element. Warping of the semiconductor device is reduced by the action of this recess portion.

9 Claims, 10 Drawing Sheets

FIG. 15A
PRIOR ART
FIG. 15B
PRIOR ART
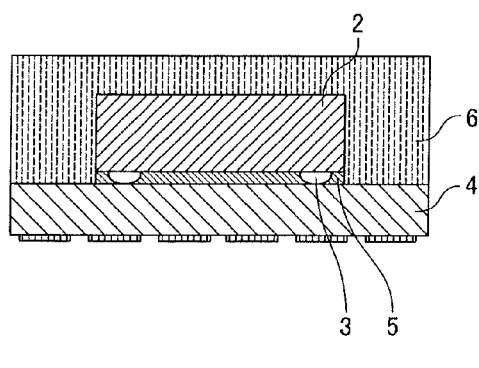
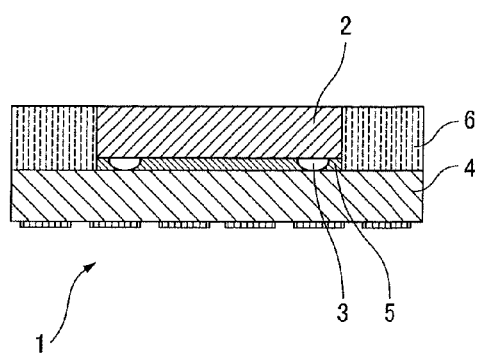
FIG. 16
PRIOR ART
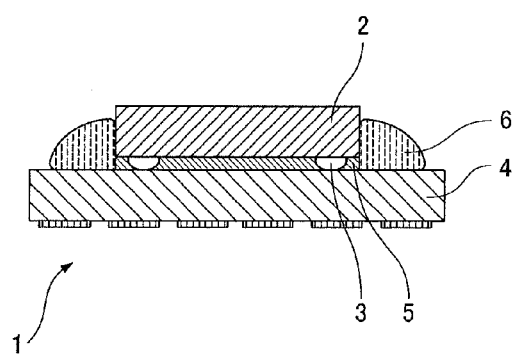

SEMICONDUCTOR DEVICE AND METHOD OF MANUFACTURING THE SAME

BACKGROUND OF THE INVENTION

1. Field of the Invention

The present invention relates to a semiconductor device in which a semiconductor element is flip-chip mounted on a circuit substrate.

2. Description of the Related Art

In recent years, reduction in the size and weight of semiconductor devices has been demanded in the field of electrical products, and especially portable equipment. For this reason, BGA (Ball Grid Array) and CSP (Chip Size Package) technologies are used in circuit substrates made of resin.

After flip-chip mounting a semiconductor element on a circuit substrate, the upper surface of the circuit substrate may be sealed with resin so as to cover the semiconductor element, with the aim of protecting the semiconductor element. Possible methods of sealing with resin are a method of sealing by injection molding using a die, or a method of sealing the upper surface of the circuit substrate by applying resin using a dispenser.

However, in this sealed semiconductor device, under normal temperature conditions, warping occurs which causes the center of the circuit substrate to become depressed, and, under high temperature conditions, warping occurs which causes the center of the circuit substrate to be mounded upwards. In a semiconductor device having large warping of this kind, the thickness of the semiconductor device becomes greater. Moreover, if this semiconductor device is mounted on another mother board, electrical connection defects occur between the semiconductor device and the mother board.

Japanese Patent No. 3420748 discloses a method which grinds the whole surface of a semiconductor device sealed with resin. FIG. 15A shows a semiconductor device before grinding. A semiconductor element 2 is bonded to a circuit substrate 4 by means of a flip-chip method, via a projecting electrode 3. An underfill resin 5 is disposed between the semiconductor element 2 and the circuit substrate 4, and the bond is maintained by the contraction of the underfill resin 5. The semiconductor element 2 mounted on the circuit substrate 4 is covered and sealed by a sealing resin 6 which is different from the underfill resin 5. Next, reduction of the thickness of a semiconductor device 1, as shown in FIG. 15B, is sought by grinding the whole surface of the sealing resin 6 until the semiconductor element 2 is exposed by back grinding, from the rear surface of the semiconductor element 2 (the upper side in FIG. 15B).

Japanese Patent Application Laid-open No. 2006-128488 proposes a method for applying the sealing resin 6 by a dispenser to the side surface of the semiconductor element 2 which is flip-chip mounted via the projecting electrode 3 to the circuit substrate 4, as shown in FIG. 16.

However, if the whole surface of the semiconductor device is ground until the rear surface of the semiconductor element 2 is exposed as shown in FIG. 15A and FIG. 15B, then the sealing resin 6 on the rear surface of the semiconductor element 2 and the sealing resin 6 surrounding the semiconductor element 2 are reduced, and therefore it is not possible to eliminate the problem of warping of the semiconductor device 1.

More specifically, under normal temperature conditions, warping occurs in the semiconductor device 1 in such a manner that the center of the circuit substrate 4 is mounded upwards, and under high temperature conditions, warping occurs in the semiconductor device 1 in such a manner that the center of the circuit substrate 4 is depressed. Consequently, electrical connection errors occur when the semiconductor device 1 is mounted on a mother board.

Furthermore, in the case of FIG. 16 where the sealing resin 6 is applied by a dispenser onto the side face of the semiconductor element 2, the height or width of the applied sealing resin 6 becomes instable and the amount of warping of the semiconductor device 1 fluctuates. Moreover, since the sealing resin 6 is applied by a dispenser, then the production tact time becomes longer.

SUMMARY OF THE INVENTION

An object of the present invention is to provide a semiconductor device and a method of manufacturing the same whereby the warping of the semiconductor device can be reduced while protecting a semiconductor element.

The semiconductor device according to the present invention is a semiconductor device in which a semiconductor element is flip-chip mounted onto a circuit substrate and the semiconductor element is covered and sealed with a sealing resin, wherein a recess portion is formed in the sealing resin on a surface opposite to the mounting surface of the semiconductor element.

More specifically, the upper surface of the semiconductor element is exposed on the bottom of the recess portion.

Furthermore, the recess portion is formed by a straight line-shaped groove and the width of the groove is smaller than the width of the semiconductor element.

Moreover, the recess portion is constituted by a plurality of grooves intersecting with each other in the center of the upper surface of the semiconductor element. Furthermore, the coefficient of thermal expansion of the sealing resin is greater than the coefficient of thermal expansion of the circuit substrate and smaller than the coefficient of thermal expansion of an underfill resin interposed between the circuit substrate and the semiconductor element.

Furthermore, the glass transition temperature of the sealing resin is lower than the glass transition temperature of the circuit substrate.

The method of manufacturing a semiconductor device according to the present invention is a method of manufacturing a semiconductor device including the steps of: flip-chip mounting a plurality of semiconductor elements on a circuit substrate; sealing the plurality of mounted semiconductor elements with a sealing resin; and making incisions by means of a dicing apparatus and dividing the circuit substrate so as to include at least one semiconductor element, wherein, in a step prior to making the incisions by the dicing apparatus, a groove is formed in the sealing resin on a surface opposite to the mounting surface of the semiconductor element.

Desirably, the groove is formed in such a manner that the bottom surface thereof is the upper surface of the semiconductor element.

Furthermore, the recess portion is formed by a straight line-shaped groove and the width of the groove is made smaller than the width of the semiconductor element.

Moreover, the recess portion is formed by a plurality of grooves intersecting with each other in the center of the upper surface of the semiconductor element.

Furthermore, the sealing resin used is a sealing resin having a coefficient of thermal expansion greater than the coefficient of thermal expansion of the circuit substrate and smaller than the coefficient of thermal expansion of an underfill resin interposed between the circuit substrate and the semiconductor element.

Furthermore, the sealing resin used is a sealing resin having a glass transition temperature lower than the glass transition temperature of the circuit substrate.

According to this composition, it is possible to control the amount of warping of the semiconductor device stably by means of the recess portion formed along the surface of the sealing resin covering the semiconductor element, the surface being opposite to the mounting surface of the semiconductor element, and hence the occurrence of connection defects can be reduced when the semiconductor device is mounted on another substrate.

BRIEF DESCRIPTION OF THE DRAWINGS

FIG. 15A is a cross-sectional diagram before grinding a conventional semiconductor device;

FIG. 15B is a cross-sectional diagram of the conventional semiconductor device; and FIG. 16 is a cross-sectional diagram of a further conventional semiconductor device.

DESCRIPTION OF THE PREFERRED EMBODIMENTS

Figure 1A:
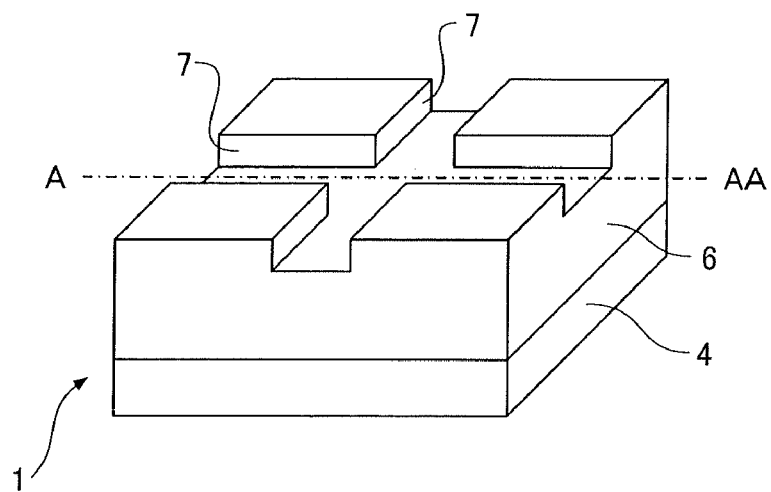
FIG. 1A is an external perspective diagram showing an enlarged view of a semiconductor device according to a first embodiment of the present invention.

Next, embodiments of the present invention will be described.

Parts having the same action are labeled with the same reference numerals.

(First Embodiment)

Figure 1B:
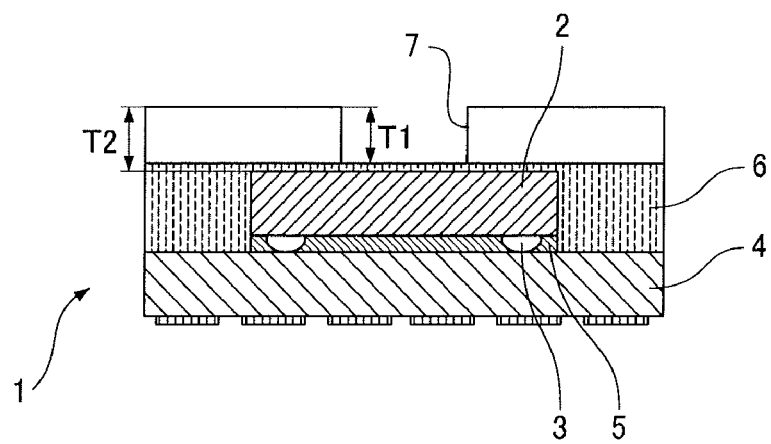
FIG. 1B is a cross-sectional diagram along line A-AA in FIG. 1A.

A semiconductor device 1 according to the first embodiment is composed as shown in FIG. 1A and FIG. 1B.

A semiconductor element 2 is bonded to a circuit substrate 4 made of resin, by means of a flip-chip method, via a projecting electrode 3. An underfill resin 5 is provided between the semiconductor element 2 and the circuit substrate 4, and the bonding between the semiconductor element 2 and the circuit substrate 4 is maintained by this underfill resin 5. The mode of the underfill resin 5 in the mounting step may be a resin in the form of a film or a resin in the form of a liquid.

In a case where the underfill resin 5 is a resin in the form of a film, before the semiconductor element 2 is flip-chip mounted, the semiconductor element 2 is thermally compression bonded to the circuit substrate 4 by pressing the semiconductor element 2 against the circuit substrate 4 via the underfill resin 5, whereby the underfill resin 5 is filled in between the semiconductor element 2 and the circuit substrate 4.

In a case where the underfill resin 5 is a resin in the form of a liquid, either the underfill resin 5 is applied to the circuit substrate 4, and this underfill resin 5 is pressed against the semiconductor element 2 and thermally compression bonded to the circuit substrate 4, before the semiconductor element 2 is flip-chip mounted on the circuit substrate 4, or alternatively the underfill resin 5 flows in between the semiconductor element 2 and the circuit substrate 4 from the side faces of the semiconductor element 2 after the semiconductor element 2 has been flip-chip mounted on the circuit substrate 4, whereupon the underfill resin 5 is thermally cured.

In this way, when the flip-chip mounting of the semiconductor element 2 onto the circuit substrate 4 is completed, the surface of the circuit substrate 4 on which the semiconductor element 2 is mounted is then sealed by a sealing resin 6 so as to cover the semiconductor element 2. In this embodiment, recess portions 7 are provided in the sealing resin 6 on the rear surface of the semiconductor element 2 (the upper side in the drawings). In this example, the recess portions 7 are formed by the intersection, in the center of the semiconductor element 2, of two linear grooves which are formed in the longitudinal and lateral directions of the semiconductor element 2.

These recess portions 7 can be formed by using a dicing apparatus which is used to divide up the circuit substrate 4, as described on the basis of FIG. 3A to FIG. 3E below. The number, height and width of the recess portions 7 can be controlled readily by means of the width of the dicing blade, the number of dicing operations and the depth of the dicing incisions. Here, the sealing resin 6 is applied to a thickness T2 from the rear surface of the semiconductor element 2, before making the incisions of the recess portions 7 by means of the dicing apparatus, and then the recess portions 7 having a depth of T1, which is shallower than the thickness T2, are formed by the dicing apparatus, as shown in FIG. 1A and FIG. 1B.

More specifically, when a semiconductor element 2 having a planar shape of 10 mm×10 mm is mounted, then as shown in FIG. 1A, by forming recess portions 7 by means of two straight lines, to a width of approximately 8 mm and a height of approximately 50 µm it is possible to control the amount of warping of the semiconductor device 1 due to the contraction of the sealing resin 6 at normal temperature, and the amount of warping of the semiconductor device 1 due to the expansion of the sealing resin 6 at high temperature.

Furthermore, compared with a semiconductor device which is not provided with recess portions 7, a semiconductor device provided with recess portions 7 has an approximately 40% reduction in the volume of the sealing resin 6 corresponding to the portion of the recess portions 7, and hence there is also a beneficial effect in that the weight of the semiconductor device 1 can reduced. Moreover, a heat radiating effect of the semiconductor element 2 can also be anticipated.

If the semiconductor element 2 is flip-chip mounted on the circuit substrate 4 by using the underfill resin 5, and the sealing resin 6 is not provided, then due to differences in the coefficients of thermal expansion of the semiconductor element 2, the circuit substrate 4 and the underfill resin 5, warping occurs in the semiconductor device 1 in such a manner that the center of the circuit substrate 4 is mounded up under normal temperature conditions, and warping occurs in the semiconductor device 1 in such a manner that the center of the circuit substrate 4 becomes depressed, under high temperature conditions.

Furthermore, if the semiconductor element 2 is sealed with the sealing resin 6 but the recess portions 7 are not provided, due to the thermal contraction of the sealing resin 6 at normal temperature and the thermal expansion of the sealing resin 6 at high temperature, then under normal temperature conditions, warping occurs in the semiconductor device 1 in such a manner that the center of the circuit substrate 4 becomes depressed, and under high temperature conditions, warping occurs in the semiconductor device 1 in such a manner that the center of the circuit substrate 4 is mounded up.

As opposed to this, by forming the recess portions 7 having a suitable width and depth as shown in FIG. 1A and FIG. 1B, it is possible to reduce the amount of warping of the semiconductor device 1, by controlling the amount of warping of the semiconductor device 1 caused by the contraction of the sealing resin 6 at normal temperature and the amount of warping of the semiconductor device 1 caused by the expansion of the resin 6 at high temperature. Consequently, it is possible to reduce bonding defects when the semiconductor device 1 is mounted on another substrate, such as a mother board or the like.

Figure 2:
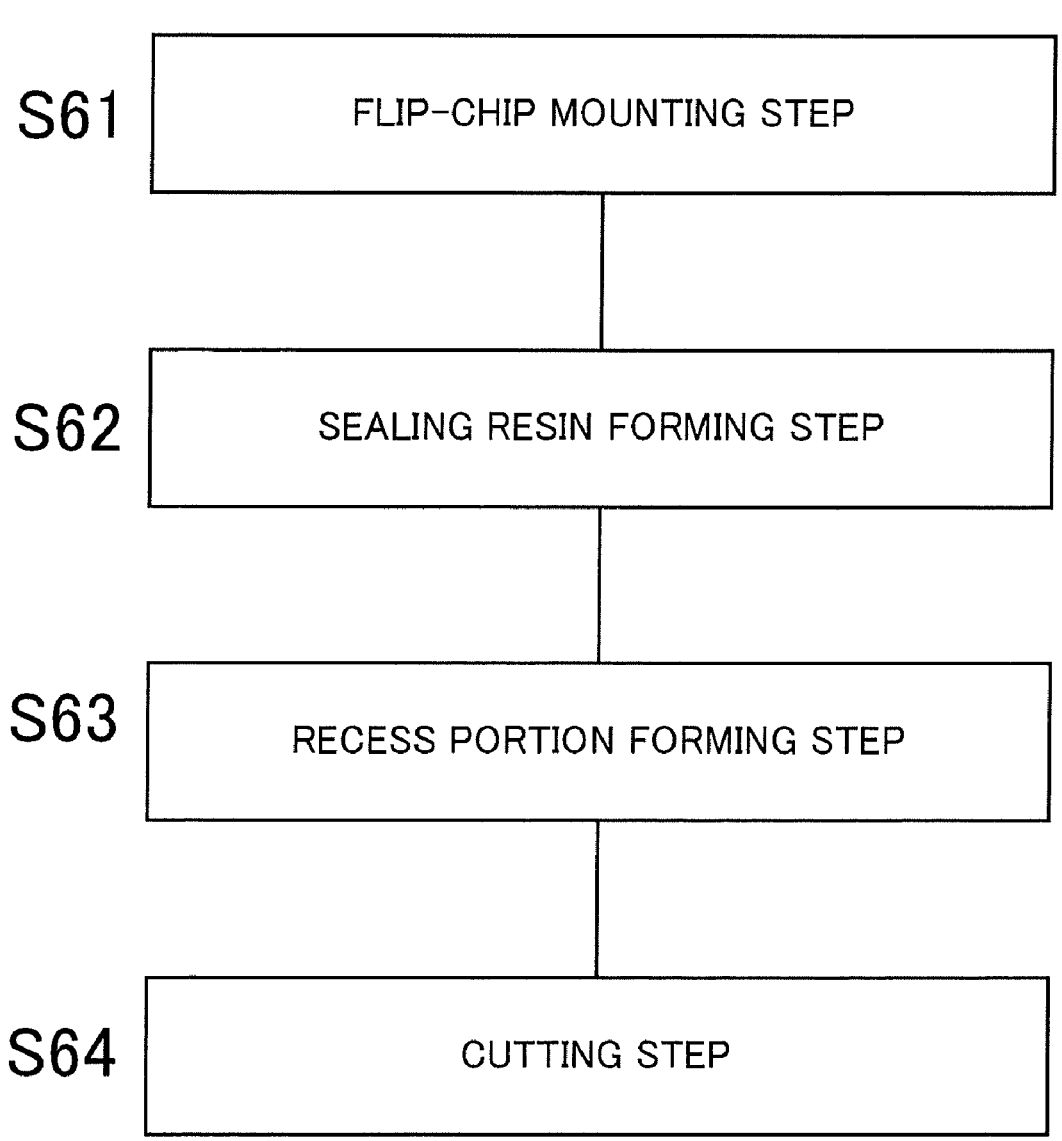
FIG. 2 is a flowchart diagram showing a method of manufacturing the semiconductor device according to the embodiment.
Figure 3A:
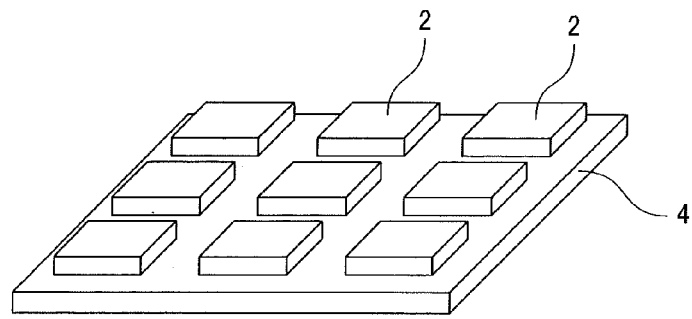
FIG. 3A is a perspective diagram of a flip-chip mounting step according to the embodiment.
Figure 3B:
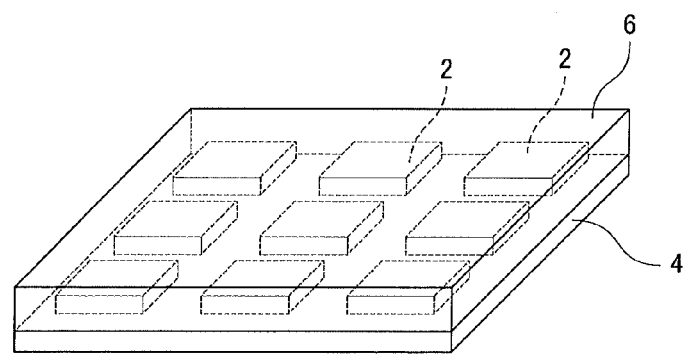
FIG. 3B is a perspective diagram of a sealing resin forming step according to the embodiment.
Figure 3C:
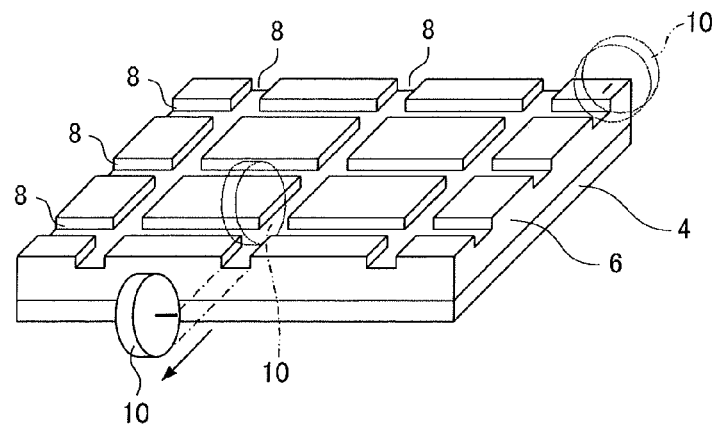
FIG. 3C is a perspective diagram of a sealing resin recess portion forming step according to the embodiment.
Figure 3D:
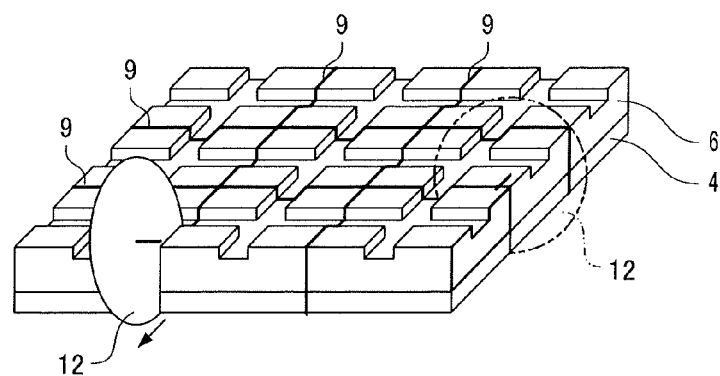
FIG. 3D is a perspective diagram of a cutting step according to the embodiment.
Figure 3E:
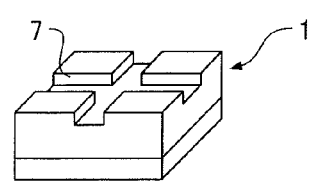
FIG. 3E is a perspective diagram of a cut semiconductor device according to the embodiment.

FIG. 3A to FIG. 3E show a method of manufacture for obtaining a plurality of the semiconductor devices 1 shown in FIG. 3E by implementing the manufacturing step shown in the flowchart in FIG. 2.

The steps for forming the recess portions 7 in the semiconductor device 1 by using the dicing apparatus are shown in FIG. 2 and FIG. 3A to FIG. 3E.

In step S61 shown in FIG. 2, the plurality of semiconductor elements 2 are flip-chip mounted on the circuit substrate 4 in a matrix configuration at suitable intervals as shown in FIG. 3A.

In step S62, the sealing resin 6 is formed on top of the circuit substrate 4 so as to seal the semiconductor element 2, as shown in FIG. 3B.

In step S63, grooves 8 which are to be the recess portions 7 are formed in the longitudinal direction and the lateral direction as shown in FIG. 3C, by moving a rotating blade 10. The blade 10 may be moved back and forth a plurality of times in order to form one groove 8.

In step S64, dicing incisions 9 are formed as indicated by FIG. 3D, by a blade 12 which is thinner than the blade 10, thereby dividing into individual semiconductor devices 1 forming products, as shown in FIG. 3E.

Here, the incisions 9 are inserted so as to encompass each individual semiconductor element 2, but it is also possible to manufacture a desired semiconductor device 1 by inserting the incisions 9 so as to encompass at least one semiconductor element 2.

(Second Embodiment)

The recess portions 7 according to the first embodiment are formed along the longitudinal and lateral directions of the semiconductor device 1, in the form of grooves intersecting perpendicularly in the center of the semiconductor element 2. However, the recess portions 7 do not have to be formed in a groove shape along the longitudinal and lateral directions of the semiconductor device 1.

Figure 4A:
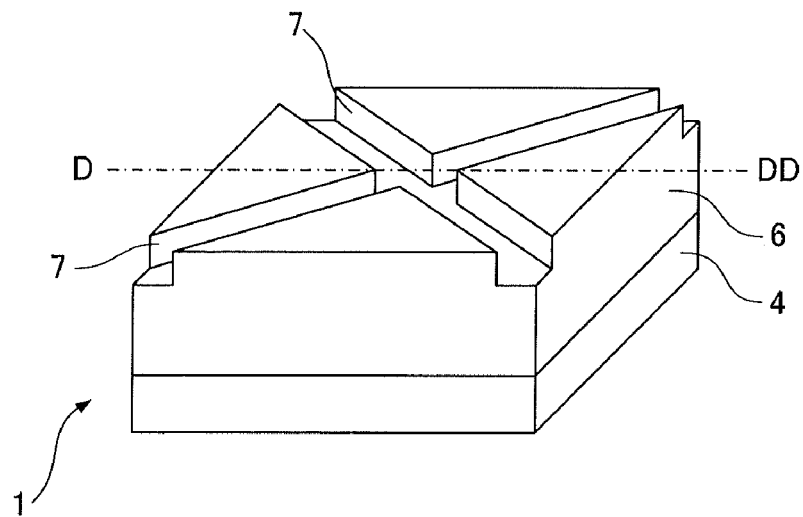
FIG. 4A is an external perspective diagram showing an enlarged view of a semiconductor device according to a second embodiment of the present invention.
Figure 4B:
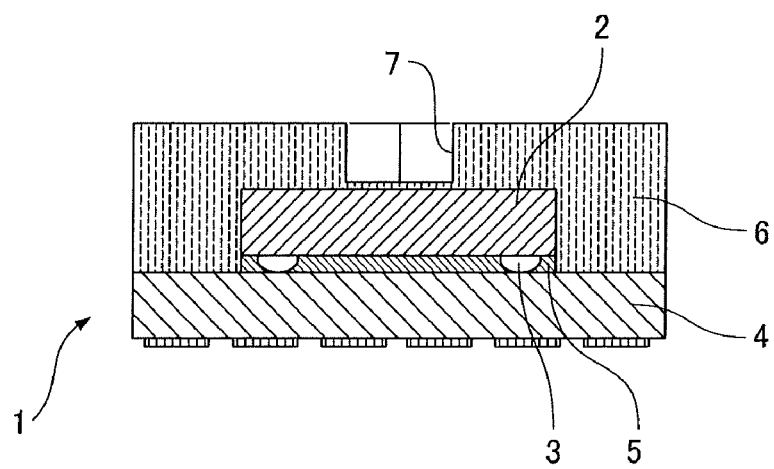
FIG. 4B is a cross-sectional diagram along line D-DD in FIG. 4A.

FIG. 4A and FIG. 4B show a semiconductor device according to a second embodiment of the invention.

FIG. 4B is a cross-sectional diagram along line D-DD in FIG. 4A. Two groove-shaped recess portions 7 are formed passing through the center of a semiconductor element 2, at an angle with respect to the longitudinal direction and the lateral direction of a semiconductor device 1. In this example, the planar shape of the semiconductor element 2 is a square shape, and the two groove-shaped recess portions 7 formed at an angle of 45° intersect with each other perpendicularly in the center of the semiconductor element 2.

If the recess portions 7 are not formed, then the warping of the semiconductor device 1 occurs in a convex shape in which the center of the semiconductor element 2 is highest, or in a concave shape in which the center of the semiconductor element 2 is lowest. Therefore, desirably, the groove-shaped recess portions 7 are formed to intersect by passing through the center of the semiconductor element 2. If the planar shape of the semiconductor element 2 is rectangular, then desirably, the groove-shaped recess portions 7 are formed to intersect by passing through the center of the semiconductor element 2.

(Third Embodiment)

Figure 5A:
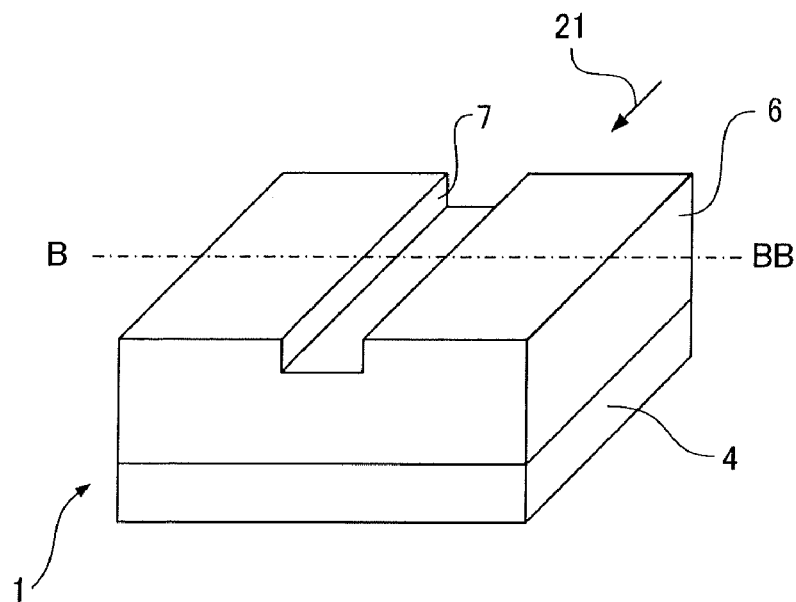
FIG. 5A is an external perspective diagram showing an enlarged view of a semiconductor device according to a third embodiment of the present invention.
Figure 5B:
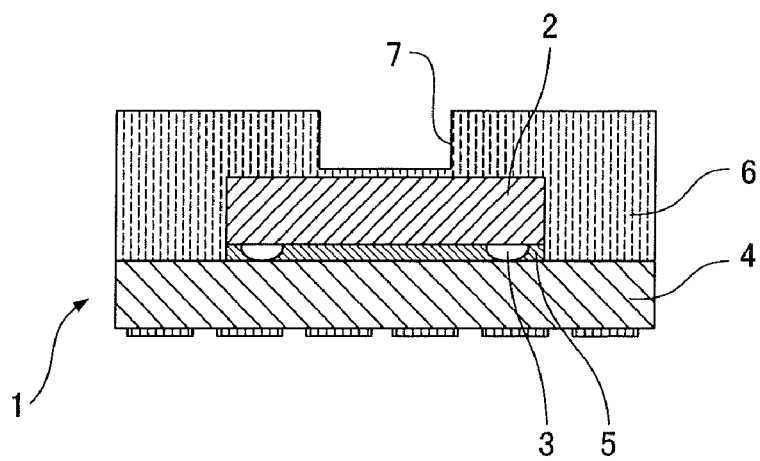
FIG. 5B is a cross-sectional diagram along line B-BB in FIG. 5A.

In the respective embodiments described above, the plurality of groove-shaped recess portions 7 are formed in the semiconductor device 1, but as shown in FIG. 5A and FIG. 5B, even if there is a single groove-shaped recess portion 7, similar beneficial effects can be expected by appropriately selecting the position and dimension of the recess portion to be formed.

FIG. 5B shows a cross-sectional diagram along line B-BB in FIG. 5A. The warping of a semiconductor device 1 has directionality depending on the wiring pattern (not illustrated) of the semiconductor device 1 on a circuit substrate 4, the direction of warping produced by the residual copper rate of a copper foil layer where this wiring pattern is formed, and the amount of warping of the other substrate onto which the semiconductor device 1 is mounted. Therefore, when reducing the warping of the semiconductor device 1 which has directionality, in a case where the direction in which the warping is to be reduced is the direction of an arrow 21 in the example in FIG. 5A, the groove-shaped recess portions 7 are formed so as to extend in the direction of this arrow 21. If the planar shape of a semiconductor element 2 is square, then the width of the grooves of the recess portions 7 is equal to or less than the length of one side of the semiconductor element. If the planar shape of the semiconductor element 2 is rectangular, then the width of the grooves is equal to or less than the length of the shorter sides of the semiconductor element 2.

(Fourth Embodiment)

Here, a desirable relationship between the coefficient of thermal expansion of the underfill resin 5, the coefficient of thermal expansion of the sealing resin 6 and the coefficient of thermal expansion of the circuit substrate 4 in the respective embodiments described above will now be explained.

Normally, the underfill resin 5 includes a heat-curable epoxy resin and 30 to 60 wt % of an inorganic filling material in order to lower the coefficient of thermal expansion, and has a coefficient of thermal expansion of 30 to 50 ppm. The circuit substrate 4 usually incorporates glass fibers and the like, and therefore has a coefficient of thermal expansion of 9 to 20 ppm.

In order to reduce the warping of a semiconductor device 1, it is necessary to make the coefficient of thermal expansion of the sealing resin 6 greater than the coefficient of thermal expansion of the circuit substrate 4. Moreover, since the bond between a semiconductor element 2 and the circuit substrate 4 is maintained by the underfill resin 5, then the coefficient of thermal expansion of the sealing resin 6 needs to be smaller than the coefficient of thermal expansion of the underfill resin 5.

If a sealing resin 6 having a larger coefficient of thermal expansion than the underfill resin 5 is used, then the occurrence of thermal expansion of the sealing resin 6, in addition to the thermal expansion of the underfill resin 5, causes an increase in a stress acting on a projecting electrode 3 in a bonding portion between the semiconductor element 2 and the circuit substrate 4. Therefore, if a load such as a temperature cycle, acts on the semiconductor device 1, then it is not possible to maintain the bond between the semiconductor element 2 and the circuit substrate 4.

Consequently, although it depends on the combination of the circuit substrate 4 and the underfill resin 5, a suitable value for the coefficient of thermal expansion of the sealing resin 6 is 20 to 45 ppm, and desirably, the relationship between the respective coefficients of thermal expansion is:

circuit substrate 4<sealing resin 6<underfill resin 5.

Furthermore, in a method of forming sealing resin 6 by injection molding using a die, since the die is expensive, if there is a change in the size or thickness of the semiconductor element 2 or the wiring pattern, thickness or the like of the circuit substrate 4, then changing the thickness of the sealing resin 6 in order to obtain a warp reducing effect involves an increase in costs. Moreover, in a method in which the sealing resin 6 is deposited by a dispenser, there is a significant fluctuation in the thickness of the sealing resin 6, and ultimately, this results in a fluctuation in the amount of warping of the semiconductor device 1.

Therefore, by making the coefficient of thermal expansion of the sealing resin 6 equal to or higher than the coefficient of thermal expansion of the circuit substrate 4 and equal to or lower than the coefficient of thermal expansion of the underfill resin 5, and by also providing recess portions 7, effective quantitative control of the amount of warping of the semiconductor device 1 is achieved.

As a concrete example, in a semiconductor device 1 in which a semiconductor element 2 having a 10 mm×10 mm planar shape is flip-chip mounted on a circuit substrate 4, if two groove-shaped recess portions 7 are formed, then the respective dimensions of the recess portions 7 may be formed to a width of approximately 8 mm and a depth of approximately 50 μm.

(Fifth Embodiment)

Here, a desirable relationship between the glass transition temperature of the sealing resin 6 and the glass transition temperature of the circuit substrate 4 in the respective embodiments described above will be explained.

In a semiconductor device in which a semiconductor element 2 is simply flip-chip mounted on a circuit substrate 4 and is not sealed with a sealing resin 6, warping occurs in the semiconductor device 1 in such a manner that the center of the circuit substrate 4 is mounded up under normal temperature conditions, and warping occurs in the semiconductor device 1 in such a manner that the center of the circuit substrate 4 becomes depressed under high temperature conditions.

The sealing resin 6 disposed so as to cover the circuit substrate 4 and the semiconductor element 2 reduces the warping of the semiconductor device 1 in which the center of the circuit substrate 4 is mounded up by contraction at normal temperature, and reduces the warping of the semiconductor device 1 in which the center of the circuit substrate 4 becomes depressed by expansion at high temperature, and therefore the sealing resin 6 reaches the glass transition temperature at a temperature lower than the glass transition temperature of the circuit substrate 4 and this is effective in reducing the warping of the semiconductor device 1.

(Sixth Embodiment)

Figure 6:
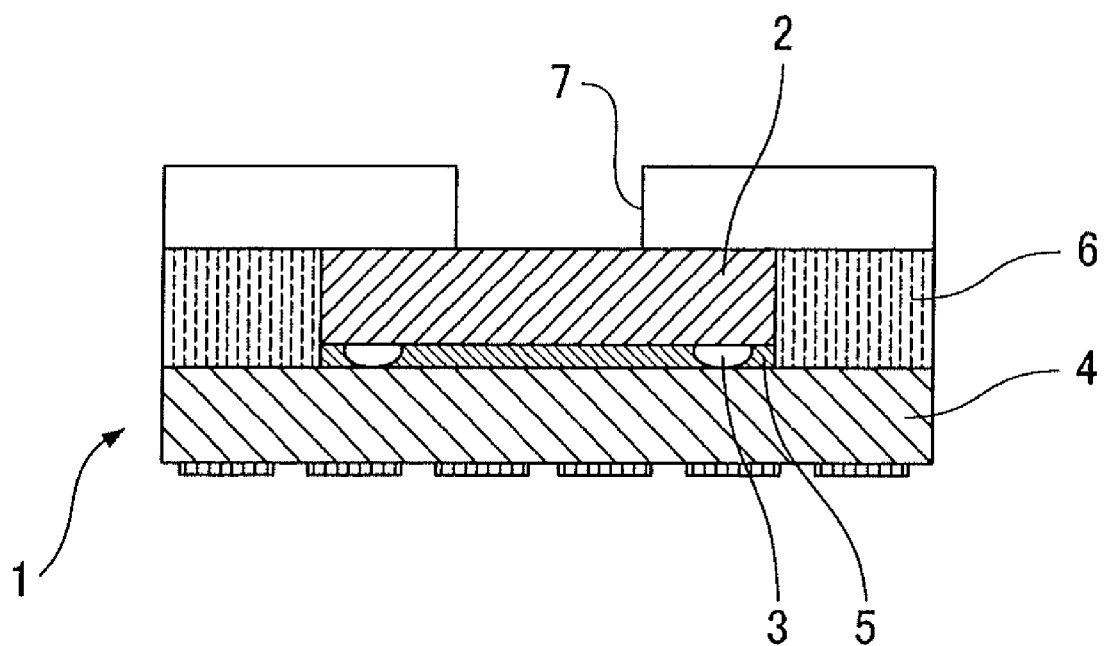
FIG. 6 is a cross-sectional diagram of a semiconductor device according to a sixth embodiment of the present invention.

In the respective embodiments described above, at least one groove-shaped recess portion 7 is formed in the sealing resin 6 of the semiconductor device 1. These recess portions 7 are formed in such a manner that T1<T2, as shown in FIG. 1B, and the semiconductor element 2 is not exposed in the recess portions 7, but as shown in FIG. 6, virtually similar beneficial effects can be expected if the semiconductor element 2 is composed so as to be exposed in the recess portions 7.

(Seventh Embodiment)

Figure 7A:
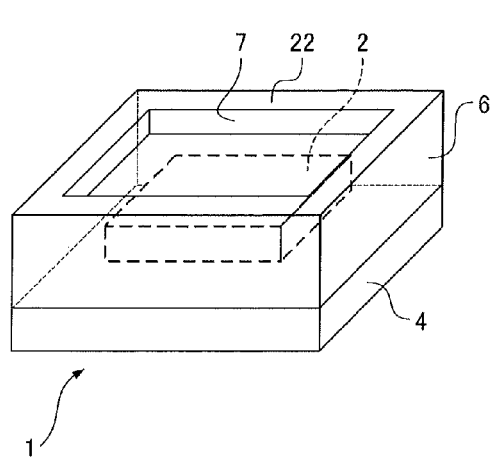
FIG. 7A is an external perspective diagram showing an enlarged view of a semiconductor device according to a seventh embodiment of the present invention.
Figure 7B:
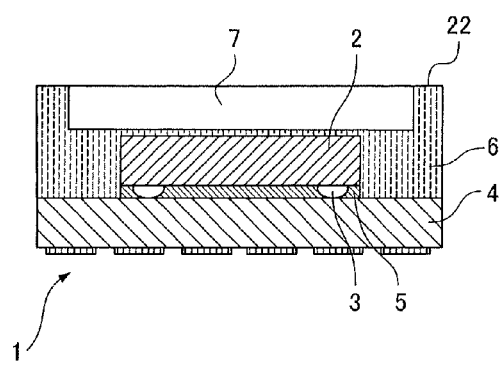
FIG. 7B is a cross-sectional diagram of FIG. 7A.

In the respective embodiments described above, at least one straight groove-shaped recess portion 7 is formed in the sealing resin 6 of the semiconductor device, but in the seventh embodiment which is shown in FIG. 7A and FIG. 7B, a recess portion 7 is formed on the upper surface of a sealing resin 6 so as to form a ring-shaped wall 22 having a square planar shape along the outer perimeter of a semiconductor element 2. In this composition, similar beneficial effects can be expected by forming the recess portion 7 at a suitable position and to suitable dimensions, in accordance with the shape of the semiconductor element 2.

(Eighth Embodiment)

Figure 8A:
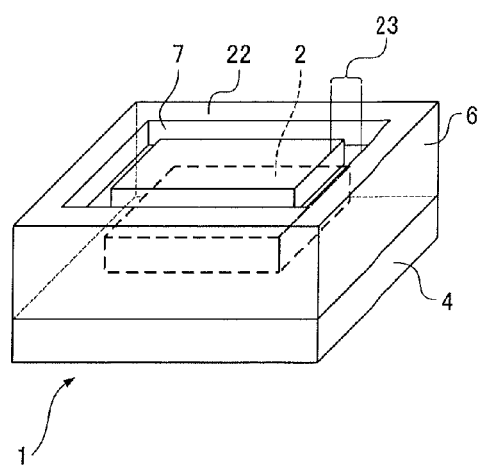
FIG. 8A is an external perspective diagram showing an enlarged view of a semiconductor device according to an eighth embodiment of the present invention.
Figure 8B:
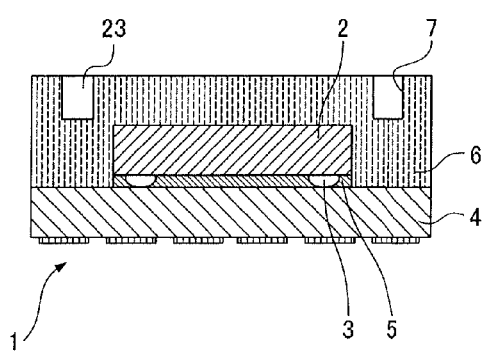
FIG. 8B is a cross-sectional diagram of FIG. 8A.

In the respective embodiments described above, at least one straight groove-shaped recess portion 7 is formed in the sealing resin 6 of the semiconductor device, but in the eighth embodiment which is shown in FIG. 8A and FIG. 8B, a recess portion 7 is formed on the upper surface of a sealing resin 6 so as to form a ring-shaped groove 23 having a square planar shape along the outer perimeter of a semiconductor element 2.

In this composition, similar beneficial effects can be expected by forming the recess portion 7 at a suitable position and to suitable dimensions, in accordance with the shape of the semiconductor element 2.

(Ninth Embodiment)

Figure 9A:
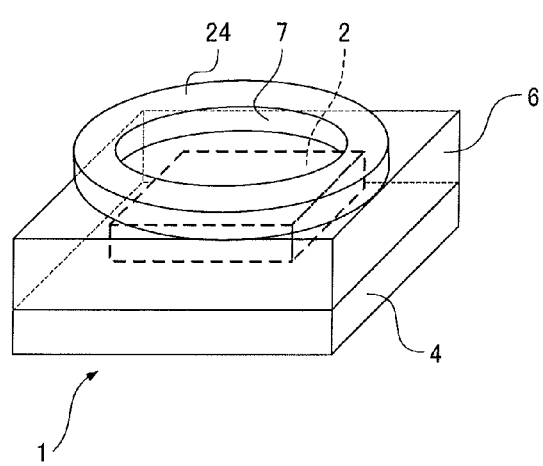
FIG. 9A is an external perspective diagram showing an enlarged view of a semiconductor device according to a ninth embodiment of the present invention.
Figure 9B:
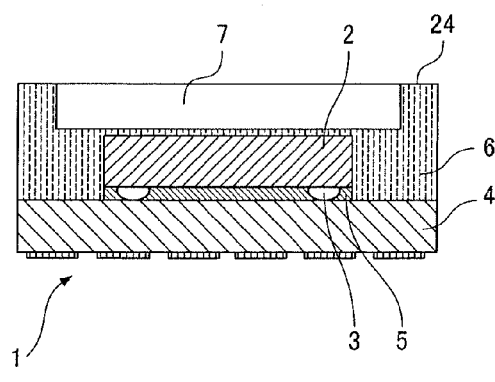
FIG. 9B is a cross-sectional diagram of FIG. 9A.

In the respective embodiments described above, at least one straight groove-shaped recess portion 7 is formed in the sealing resin 6 of the semiconductor device, but in the ninth embodiment which is shown in FIG. 9A and FIG. 9B, a recess portion 7 is formed on the upper surface of a sealing resin 6 so as to form a ring-shaped wall 24 having a circular arc-shaped planar shape along the outer perimeter of a semiconductor element 2.

In this composition, similar beneficial effects can be expected by forming the recess portion 7 at a suitable position and to suitable dimensions, in accordance with the shape of the semiconductor element 2.

(Tenth Embodiment)

Figure 10A:
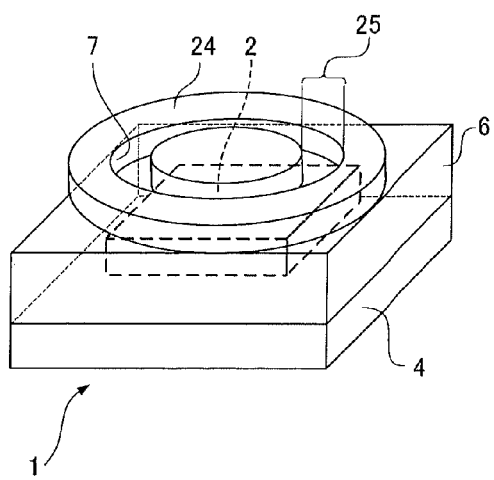
FIG. 10A is an external perspective diagram showing an enlarged view of a semiconductor device according to a tenth embodiment of the present invention.
Figure 10B:
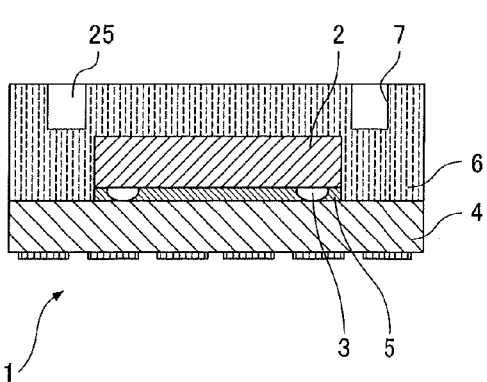
FIG. 10B is a cross-sectional diagram of FIG. 10A.

In the respective embodiments described above, at least one straight groove-shaped recess portion 7 is formed in the sealing resin 6 of the semiconductor device, but in the tenth embodiment which is shown in FIG. 10A and FIG. 10B, a recess portion 7 is formed on the upper surface of a sealing resin 6 so as to form a ring-shaped groove 25 having a circular arc-shaped planar shape along the outer perimeter of a semiconductor element 2.

In this composition, similar beneficial effects can be expected by forming the recess portion 7 at a suitable position and to suitable dimensions, in accordance with the shape of the semiconductor element 2.

(Eleventh Embodiment)

Figure 11:
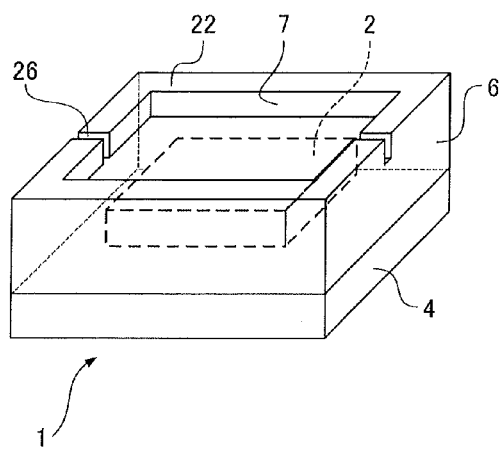
FIG. 11 is an external perspective diagram of a modification example of FIG. 7A.
Figure 13:
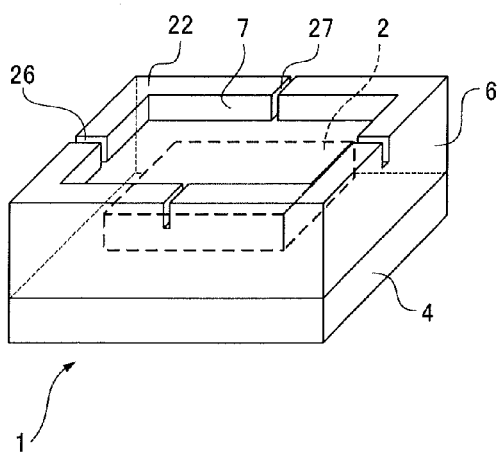
FIG. 13 is an external perspective diagram of a further modification example of FIG. 7A.

In the seventh embodiment shown in FIG. 7A and FIG. 7B, the recess portion 7 is formed so as to form the ring-shaped wall 22 on the upper surface of the sealing resin 6, but in the examples shown in FIG. 11 and FIG. 13, a portion of the ring-shaped wall 22 is cut by grooves 26 and 27.

In this composition, similar beneficial effects can be expected by forming a recess portion 7 and the grooves 26 and 27 at suitable positions and to suitable dimensions, in accordance with the shape of a semiconductor element 2.

Figure 12:
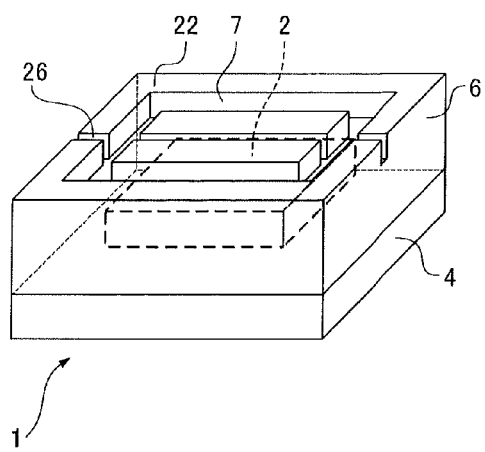
FIG. 12 is an external perspective diagram of a modification example of FIG. 8A.
Figure 14:
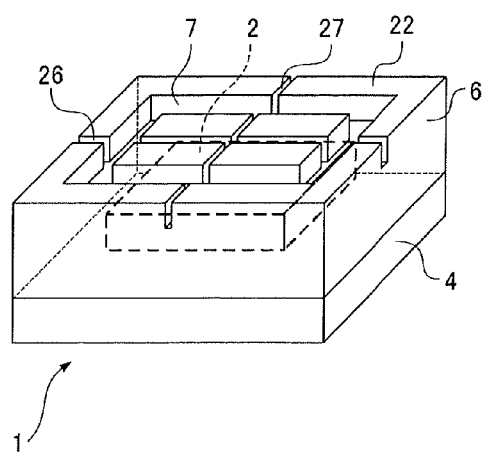
FIG. 14 is an external perspective diagram of a further modification example of FIG. 8A.

In the eighth embodiment shown in FIG. 8A and FIG. 8B, the recess portion 7 is formed so as to form the ring-shaped groove 23 on the upper surface of the sealing resin 6, but in the examples shown in FIG. 12 and FIG. 14, a portion of the ring-shaped groove 23 is cut by the grooves 26 and 27.

In this composition, similar beneficial effects can be expected by forming the recess portion 7 and the grooves 26 and 27 at suitable positions and to suitable dimensions, in accordance with the shape of the semiconductor element 2.

FIG. 11 to FIG. 14 show modification examples of FIG. 7A and FIG. 7B and modification examples of FIG. 8A and FIG. 8B, but the same can be implemented in the case of the modification examples in FIG. 9A and FIG. 9B and the modification examples in FIG. 10A and FIG. 10B.

The recess portions 7 in the second, third and sixth embodiments can be formed on the upper surface of the sealing resin 6 by processing with a blade 10 as in FIG. 3C, similarly to the first embodiment. The recess portions 7 in the seventh embodiment to the eleventh embodiment are formed as follows: when the semiconductor element 2 is covered with the sealing resin 6 after the flip-chip mounting of the semiconductor element 2 on the circuit substrate 4 as shown in FIG. 3A, an upper mold, in which concavo-convexes corresponding to the recess portions 7 of a desired shape are formed on the side facing the semiconductor element 2, is set on top of the circuit substrate 4; and in this state, the sealing resin 6 is injected into a gap between the upper mold and the circuit substrate 4. Then, the article thus produced is removed from the upper mold and can be divided up into semiconductor devices 1 by a blade 12, similarly to the FIG. 3D.

The present invention can contribute to reducing the weight and improving the reliability of electronic devices of various types.

What is claimed is:

1. A semiconductor device, in which a semiconductor element is flip-chip mounted onto a circuit substrate and the semiconductor element is covered and sealed with a sealing resin,
wherein a recess portion is formed in the sealing resin on a surface opposite to a mounting surface of the semiconductor element, and the recess portion is constituted by a plurality of grooves intersecting with each other in a center of an upper surface of the semiconductor element.

2. A semiconductor device, in which a semiconductor element is flip-chip mounted onto a circuit substrate and the semiconductor element is covered and sealed with a sealing resin,
wherein a recess portion is formed in the sealing resin on a surface opposite to a mounting surface of the semiconductor element, and a coefficient of thermal expansion of the sealing resin is greater than a coefficient of thermal expansion of the circuit substrate and smaller than a coefficient of thermal expansion of an underfill resin interposed between the circuit substrate and the semiconductor element.

3. A semiconductor device, in which a semiconductor element is flip-chip mounted onto a circuit substrate and the semiconductor element is covered and sealed with a sealing resin,
wherein a recess portion is formed in the sealing resin on surface opposite to a mounting surface of the semiconductor element, and a glass transition temperature of the sealing resin is lower than a glass transition temperature of the circuit substrate.

4. A method of manufacturing a semiconductor device, comprising the steps of:
flip-chip mounting a plurality of semiconductor elements on a circuit substrate;
sealing the plurality of mounted semiconductor elements with a sealing resin; and
making incisions by means of a dicing apparatus and dividing the circuit substrate so as to include at least one semiconductor element,
wherein, in a step prior to making the incisions by the dicing apparatus, a groove is formed in the sealing resin on a surface opposite to a mounting surface of the semiconductor element.

5. The method of manufacturing a semiconductor device according to claim 4, wherein the groove is formed in such a manner that a bottom surface thereof is an upper surface of the semiconductor element.

6. The method of manufacturing a semiconductor device according to claim 4, wherein the recess portion is formed by a straight line-shaped groove and a width of the groove is made smaller than a width of the semiconductor element.

7. The method of manufacturing a semiconductor device according to claim 4, wherein the recess portion is formed by a plurality of grooves intersecting with each other in a center of an upper surface of the semiconductor element.

8. The method according to claim 4, wherein the sealing resin used is a sealing resin having a coefficient of thermal expansion greater than a coefficient of thermal expansion of the circuit substrate and smaller than a coefficient of thermal expansion of an underfill resin interposed between the circuit substrate and the semiconductor element.

9. The method of manufacturing a semiconductor device according to claim 4, wherein the sealing resin used is a sealing resin having a glass transition temperature lower than a glass transition temperature of the circuit substrate.

* * * * *